(12) United States Patent
Miyake et al.

(10) Patent No.: US 9,349,750 B2
(45) Date of Patent: May 24, 2016

(54) SEMICONDUCTOR DEVICE AND DISPLAY DEVICE

(71) Applicants: Hiroyuki Miyake, Atsugi (JP); Shunpei Yamazaki, Setagaya (JP); Yoshifumi Tanada, Takayama (JP); Manabu Sato, Tochigi (JP); Toshinari Sasaki, Shinagawa (JP); Kenichi Okazaki, Tochigi (JP); Junichi Koezuka, Tochigi (JP); Takuya Matsuo, Osaka (JP); Hiroshi Matsukizono, Osaka (JP); Yosuke Kanzaki, Osaka (JP); Shigeyasu Mori, Osaka (JP)

(72) Inventors: Hiroyuki Miyake, Atsugi (JP); Shunpei Yamazaki, Setagaya (JP); Yoshifumi Tanada, Takayama (JP); Manabu Sato, Tochigi (JP); Toshinari Sasaki, Shinagawa (JP); Kenichi Okazaki, Tochigi (JP); Junichi Koezuka, Tochigi (JP); Takuya Matsuo, Osaka (JP); Hiroshi Matsukizono, Osaka (JP); Yosuke Kanzaki, Osaka (JP); Shigeyasu Mori, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 113 days.

(21) Appl. No.: 14/077,390

(22) Filed: Nov. 12, 2013

(65) Prior Publication Data

US 2014/0139775 A1    May 22, 2014

(30) Foreign Application Priority Data

Nov. 16, 2012   (JP) ................................ 2012-252106

(51) Int. Cl.
*H01L 27/12*    (2006.01)
*H01L 29/786*    (2006.01)

(52) U.S. Cl.
CPC .......... *H01L 27/1225* (2013.01); *H01L 27/124* (2013.01); *H01L 29/78648* (2013.01)

(58) Field of Classification Search
CPC .................. G02F 1/1368; G02F 2001/134318; G02F 1/134363; H01L 29/78648; H01L 27/1225; H01L 27/124
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Charles Chang
(74) *Attorney, Agent, or Firm* — Eric J. Robinson; Robinson Intellectual Property Law Office, P.C.

(57) ABSTRACT

A semiconductor device includes: a transistor including a gate electrode, a gate insulating film over the gate electrode, a semiconductor layer over the gate insulating film, and a source electrode and a drain electrode over the semiconductor layer; a first insulating film comprising an inorganic material over the transistor; a second insulating film comprising an organic material over the first insulating film; a first conductive film over the second insulating film and in a region overlapping with the semiconductor layer; a third insulating film comprising an inorganic material over the first conductive film; and a second conductive film over the third insulating film and in a region overlapping with the first conductive film. The absolute value of a first potential applied to the first conductive film is greater than the absolute value of a second potential applied to the second conductive film.

6 Claims, 3 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134397 A1* | 6/2010 | Ishitani ............ G02F 1/133514 345/92 |
| 2011/0012117 A1* | 1/2011 | Yamazaki et al. ............... 257/59 |
| 2011/0058133 A1* | 3/2011 | Ishigaki et al. ............... 349/138 |
| 2011/0210332 A1* | 9/2011 | Jintyou et al. ................. 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using amorphous oxide semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White TANDEM OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZNO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phase for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFe2O4, and YB2Fe3O7 Types of Structures for Compounds in the In2O3 and SC2O3-A2O3-BO Systems [A; Fe, Ga, or Al; B: Mg, Fe, Ni, Cu, or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett,. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band electrically conducting amorphous oxides and examples,", Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

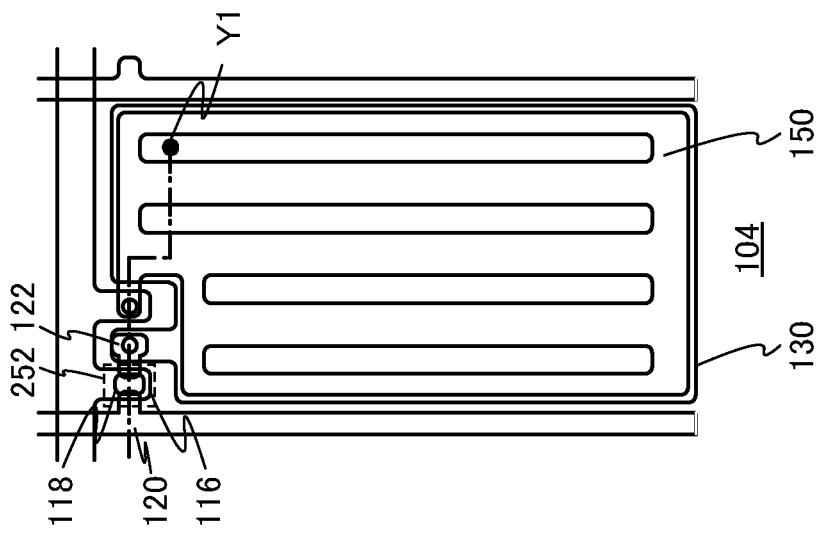
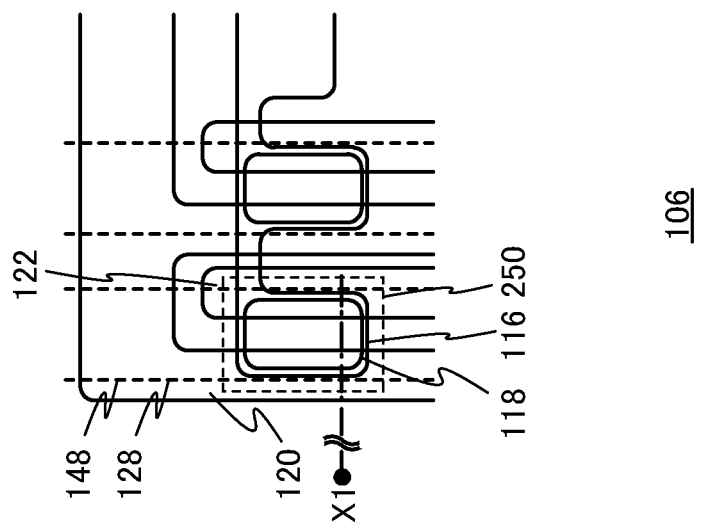
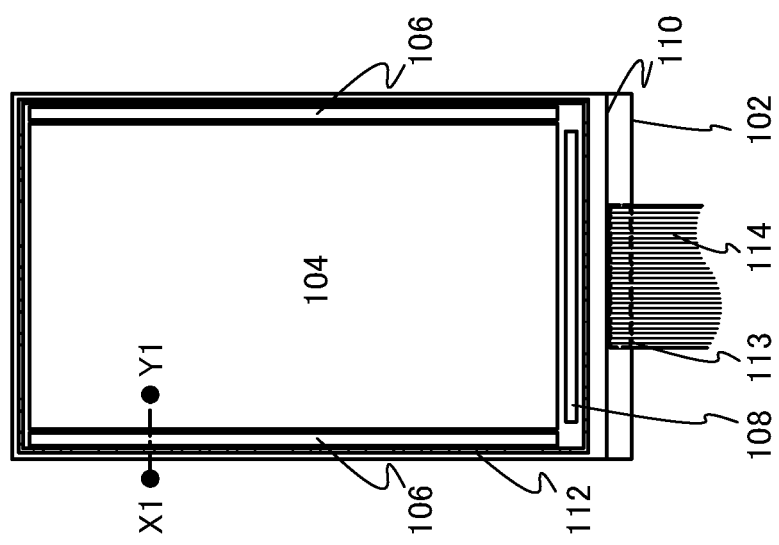

SEMICONDUCTOR DEVICE AND DISPLAY DEVICE

BACKGROUND OF THE INVENTION

1. Field of the Invention

The present invention relates to a semiconductor device and a display device. In this specification, a semiconductor device refers to a semiconductor element itself or a device including a semiconductor element. As an example of such a semiconductor element, for example, a transistor (such as a thin film transistor) can be given. In addition, a semiconductor device also refers to a display device such as a liquid crystal display device.

2. Description of the Related Art

In recent years, display devices using liquid crystal panels and display devices using organic EL panels have been under active development. These display devices are broadly classified into display devices in which only transistors for pixel control (pixel transistors) are formed over a substrate and scanning circuits (driver circuits) are included in peripheral ICs and display devices in which scanning circuits are formed over the same substrate as pixel transistors.

Display devices in which driver circuits are integrated with pixel transistors are more effective for reduction in frame width of the display devices or cost of the peripheral ICs. However, transistors used in the driver circuits are required to have better electrical characteristics (e.g., field-effect mobility ($\mu$FE) or threshold voltage) than the pixel transistors.

Although a silicon-based semiconductor material has been widely known as a material for a semiconductor thin film applicable to transistors, an oxide semiconductor is attracting attention as another notable material (e.g., Patent Documents 1 and 2). For example, attention is drawn to a transistor using as a semiconductor thin film an amorphous oxide which contains indium (In), gallium (Ga), and zinc (Zn) and has an electron carrier concentration of less than $10^{18}/cm^3$.

Transistors using oxide semiconductors for semiconductor layers have higher field-effect mobility than transistors using amorphous silicon which is a silicon-based semiconductor material for semiconductor layers. Hence, the transistors using oxide semiconductors can operate at high speed and be suitably used for the display devices in which driver circuits are integrated with pixel transistors. Besides, a manufacturing process for such transistors using oxide semiconductors is easier than a manufacturing process for transistors using polycrystalline silicon for semiconductor layers.

However, a problem of the transistors using oxide semiconductors for semiconductor layers is that entry of impurities such as hydrogen or moisture into the oxide semiconductors generates carriers and changes the threshold voltage which is one of electrical characteristics of the transistors.

REFERENCES

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a highly reliable semiconductor device in which the threshold voltage of a transistor can be controlled. Another object of one embodiment of the present invention is to provide a display device including a highly reliable semiconductor device in which the threshold voltage of a transistor can be controlled.

One embodiment of the present invention is a semiconductor device in which a back gate is provided in order to control the threshold voltage of a transistor.

One embodiment of the present invention is a semiconductor device including: a transistor including a gate electrode, a gate insulating film formed over the gate electrode, a semiconductor layer formed over the gate insulating film, and a source electrode and a drain electrode formed over the semiconductor layer; a first insulating film formed using an inorganic material over the transistor; a second insulating film formed using an organic material over the first insulating film; a first conductive film formed over the second insulating film and formed in a region overlapping with the semiconductor layer; a third insulating film formed using an inorganic material over the first conductive film; and a second conductive film formed over the third insulating film and formed in a region overlapping with the first conductive film. The absolute value of a first potential applied to the first conductive film is greater than the absolute value of a second potential applied to the second conductive film.

In the above embodiment of the present invention, the semiconductor layer is preferably an oxide semiconductor layer. In addition, in the above embodiment of the present invention, the first insulating film is preferably an oxide insulating film.

One embodiment of the present invention is a semiconductor device including a driver circuit portion, in which the driver circuit portion includes the semiconductor device described above as one embodiment of the present invention.

In the above embodiment of the present invention, it is preferable that the semiconductor device further include a pixel portion supplied with a signal by the driver circuit portion, that the pixel portion include a pixel electrode, and that the pixel electrode be electrically connected to the first conductive film. In that case, the first conductive film can be at the same potential as the pixel electrode.

One embodiment of the present invention is a semiconductor device including a pixel portion, in which the pixel portion includes the semiconductor device described above as one embodiment of the present invention.

One embodiment of the present invention is a semiconductor device including a pixel portion and a driver circuit portion for supplying a signal to the pixel portion, in which each of the pixel portion and the driver circuit portion includes the semiconductor device described above as one embodiment of the present invention.

In the above embodiment of the present invention, it is preferable that the pixel portion include a pixel electrode and the pixel electrode be electrically connected to the first conductive film. In that case, the first conductive film can be at the same potential as the pixel electrode.

In the above embodiment of the present invention, it is preferable that the pixel portion include a common electrode and the common electrode be electrically connected to the second conductive film. In that case, the second conductive film can be at the same potential as the common electrode.

In the above embodiment of the present invention, a liquid crystal layer is preferably formed over the second conductive film. In that case, the first potential applied to the first conductive film is blocked by the third insulating film and the second conductive film; thus, a potential applied from the first conductive film to the liquid crystal layer is reduced.

In the above embodiment of the present invention, the oxide semiconductor layer preferably contains at least one oxide selected from the group consisting of indium oxide, tin oxide, and zinc oxide.

In the above embodiment of the present invention, the oxide semiconductor layer is preferably an In—Ga—Zn-based oxide semiconductor layer.

In the above embodiment of the present invention, it is preferable that the oxide semiconductor layer include a crystal part and a c-axis of the crystal part be parallel to a normal vector of a surface where the oxide semiconductor layer is formed.

One embodiment of the present invention is a display device including the semiconductor device described above as one embodiment of the present invention.

One embodiment of the present invention is a display device including: a pixel electrode provided as one electrode of a liquid crystal element; a common electrode provided as the other electrode of the liquid crystal element so as to face the pixel electrode; a transistor electrically connected to at least one of the pixel electrode and the common electrode and including a gate electrode, a gate insulating film formed over the gate electrode, a semiconductor layer formed over the gate insulating film, and a source electrode and a drain electrode formed over the semiconductor layer; a first insulating film formed using an inorganic material over the transistor; a second insulating film formed using an organic material over the first insulating film; and a conductive film formed over the second insulating film and formed in a region overlapping with the semiconductor layer. The conductive film is at the same potential as the common electrode.

In accordance with one embodiment of the present invention, a highly reliable semiconductor device in which the threshold voltage of a transistor can be controlled can be provided. Furthermore, in accordance with one embodiment of the present invention, a display device including a highly reliable semiconductor device in which the threshold voltage of a transistor can be controlled can be provided.

BRIEF DESCRIPTION OF THE DRAWINGS

FIG. 1A is a top view showing the whole of a semiconductor device; FIG. 1B is a top view showing part of a driver circuit portion of the semiconductor device; and FIG. 1C is a top view showing part of a pixel portion.

DETAILED DESCRIPTION OF THE INVENTION

Figure 2A:
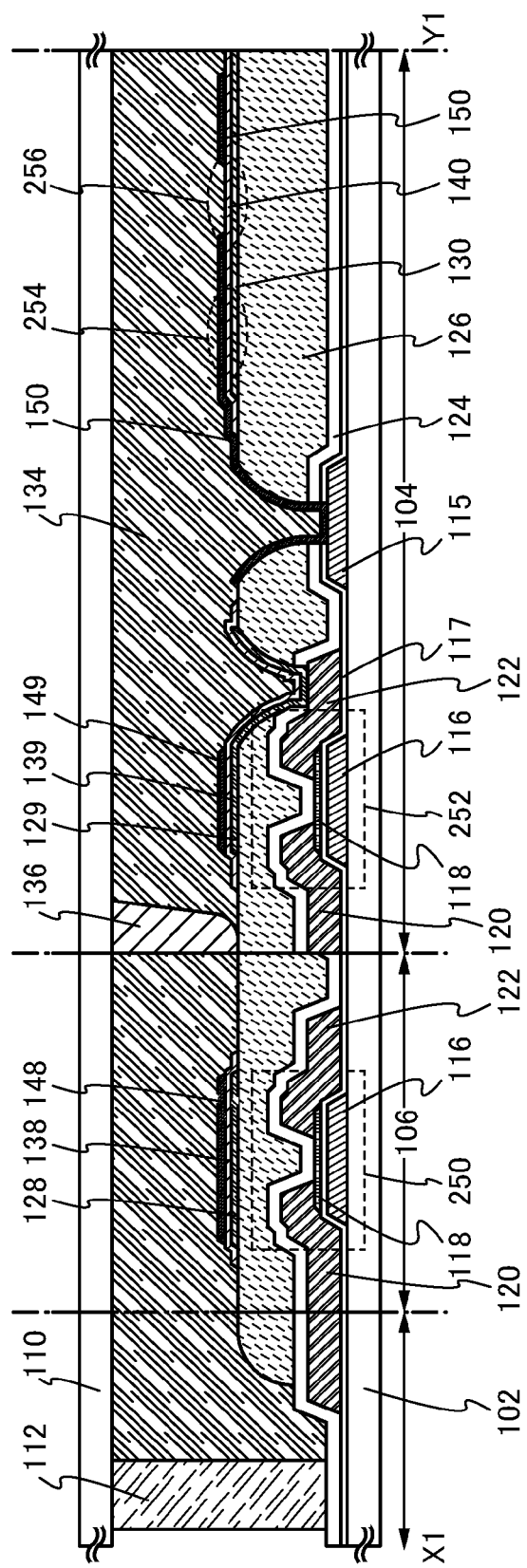
FIG. 2A is a cross-sectional view taken along the line X1-Y1 in FIGS. 1A to 1C.

Embodiments of the present invention will be described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments.

Embodiment 1

In this embodiment, one embodiment of a semiconductor device is described with reference to FIGS. 1A to 1C and FIGS. 2A and 2B.

FIGS. 1A to 1C illustrate top views of a semiconductor device as one embodiment of the semiconductor device. FIG. 1A shows the whole of the semiconductor device, FIG. 1B shows part of a driver circuit portion of the semiconductor device, and FIG. 1C shows part of a pixel portion. In addition, FIG. 2A corresponds to a cross-sectional view taken along the line X1-Y1 in FIGS. 1A to 1C. FIG. 2B is a circuit diagram of the pixel portion illustrated in FIGS. 1C and 2A.

Note that the semiconductor device described in this embodiment with reference to FIGS. 1A to 1C and FIGS. 2A and 2B is one example of a semiconductor device including a liquid crystal element of a horizontal electric field type. However, without limitation to this structure, one embodiment of the present invention may be applied to a semiconductor device including a liquid crystal element of a vertical electric field type. In addition, one embodiment of the present invention may be applied to a semiconductor device including a light-emitting element, such as an organic EL element, as a display element.

In the semiconductor device illustrated in FIG. 1A, a sealant 112 is placed so as to surround a pixel portion 104, and gate driver circuit portions 106 and a source driver circuit portion 108, which are formed over a first substrate 102, and sealing is performed with a second substrate 110. The gate driver circuit portions 106 and the source driver circuit portion 108 are located outside and adjacent to the pixel portion 104 and supply signals to the pixel portion 104. Thus, the pixel portion 104, the gate driver circuit portions 106, and the source driver circuit portion 108 are sealed with the display element by the first substrate 102, the sealant 112, and the second substrate 110.

In FIG. 1A, a flexible printed circuit (FPC) terminal portion 113 which is electrically connected to the pixel portion 104, the gate driver circuit portions 106, and the source driver circuit portion 108 is placed in a region that is different from the region surrounded by the sealant 112, over the first substrate 102. An FPC 114 is connected to the FPC terminal portion 113. Signals and potentials applied to the pixel portion 104, the gate driver circuit portions 106, and the source driver circuit portion 108 are supplied through the FPC 114.

Although an example in which the gate driver circuit portions 106 and the source driver circuit portion 108 are formed over the first substrate 102 where the pixel portion 104 is formed is illustrated in FIG. 1A, this structure does not limit the present invention. For example, only the gate driver circuit portions 106 may be formed over the first substrate 102 and a separately prepared substrate where a source driver circuit is formed (e.g., a driver circuit substrate formed using a single crystal semiconductor film or a polycrystalline semiconductor film) may be mounted on the first substrate 102.

Although an example in which the two gate driver circuit portions 106 are placed on both sides of the pixel portion 104 is illustrated in FIG. 1A, the present invention is not limited to this example. For example, a gate driver circuit portion 106 may be placed on only one side of the pixel portion 104.

Note that there is no particular limitation on the method of connecting a separately prepared driver circuit substrate, and a chip on glass (COG) method, a wire bonding method, a tape automated bonding (TAB) method, or the like can be used.

As described above, some or all of the driver circuits which include transistors can be formed over the first substrate 102 where the pixel portion 104 is formed, so that a system-on-panel can be obtained.

Figure 2B:
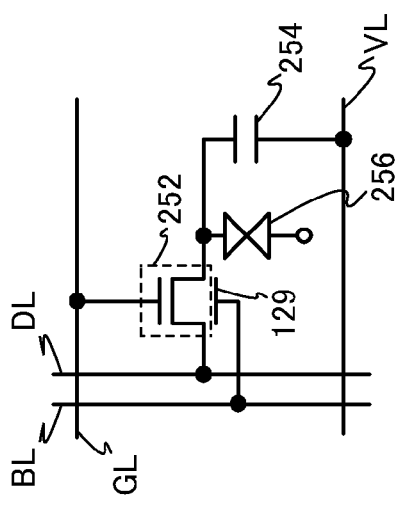
FIG. 2B is a circuit diagram of a pixel portion illustrated in FIGS. 2A and 1C.

As illustrated in FIGS. 1B and 2A, a first transistor 250 is formed in the gate driver circuit portion 106 which is a driver circuit region. In the first transistor 250, a gate electrode 116, a source electrode 120, and a drain electrode 122 are electrically connected to a semiconductor layer 118. In the gate driver circuit portion 106, a gate line including the gate electrode 116 extends horizontally, a source line including the source electrode 120 extends vertically, and a drain line including the drain electrode 122 extends vertically with a distance from the source line. Over the first transistor 250, a first conductive film 128 and a second conductive film 148 are formed. Note that the first conductive film 128 and the second conductive film 148 overlap with each other in the top view and are therefore indicated with broken lines in FIG. 1B.

The gate driver circuit portion 106 including the first transistor 250 can supply a signal to a transistor included in each pixel of the pixel portion 104.

To control various signals, raise a voltage, and the like, the first transistor 250 in the gate driver circuit portion 106 requires a relatively high voltage, specifically a voltage of about 10 V to 30 V.

Further, as illustrated in FIGS. 1C and 2A, a second transistor 252 is formed in the pixel portion 104. In the second transistor 252, the gate electrode 116, the source electrode 120, and the drain electrode 122 are electrically connected to the semiconductor layer 118.

The second transistor 252 is electrically connected to a pixel electrode 130 and a common electrode 150.

For specific description of the structure of the semiconductor device illustrated in FIGS. 1A to 1C, the structure of the gate driver circuit portion 106 and the pixel portion 104 is described below with reference to FIG. 2A corresponding to the cross-sectional view along the line X1-Y1 in FIGS. 1A to 1C.

Note that the semiconductor device illustrated in FIG. 2A is one example of a display device including a pixel electrode as one electrode of a liquid crystal element, a common electrode as the other electrode of the liquid crystal element, and a transistor electrically connected to at least one of the pixel electrode and the common electrode.

The gate driver circuit portion 106 is described below first, and then the pixel portion 104 is described.

The gate driver circuit portion 106 includes the first substrate 102 and the first transistor 250 which includes the gate electrode 116 formed over the first substrate 102, a gate insulating film 117 formed over the gate electrode 116, the semiconductor layer 118 formed over the gate insulating film 117, and the source electrode 120 and the drain electrode 122 formed over the gate insulating film 117 and the semiconductor layer 118.

In addition, the gate driver circuit portion 106 includes a first insulating film 124 formed using an inorganic material over the first transistor 250, specifically, over the gate insulating film 117, the semiconductor layer 118, the source electrode 120, and the drain electrode 122, and a second insulating film 126 formed using an organic material over the first insulating film 124.

Furthermore, the gate driver circuit portion 106 includes the first conductive film 128 formed over the second insulating film 126 over the first transistor 250 in a region overlapping with the semiconductor layer 118, a third insulating film 138 formed using an inorganic material over the first conductive film 128, and the second conductive film 148 formed over the third insulating film 138 in a region overlapping with the first conductive film 128.

The first conductive film 128 functions as a back gate electrode of the first transistor 250. By application of a potential to the first conductive film 128, the threshold voltage of the first transistor 250 can be controlled.

Specifically, in the case where the first transistor 250 is an n-type transistor, the threshold voltage of the first transistor 250 can be shifted in the positive direction by application of a negative potential to the first conductive film 128.

Note that the potential applied to the first conductive film 128 is preferably equal to or lower than a potential applied to the source electrode 120.

Note that the threshold voltage of the first transistor 250 may be controlled by application of a potential to both the first conductive film 128 and the second conductive film 148.

The third insulating film 138 and the second conductive film 148 are formed over the first conductive film 128. The potential applied to the first conductive film 128 is blocked by the third insulating film 138 and/or the second conductive film 148. That is, this structure can reduce a potential applied from the first conductive film 128 to a liquid crystal layer 134.

For example, in the case of a structure without the third insulating film 138 and the second conductive film 148, when a potential is applied to the first conductive film 128 in order to control the threshold voltage of the first transistor 250, a potential may also be applied to the liquid crystal layer 134. This might cause disordered orientation in the liquid crystal layer 134 or an image persistence problem with the liquid crystal layer 134. However, these problems can be controlled with the third insulating film 138 and the second conductive film 148.

The second conductive film 148 is preferably set at a potential equal to the potential applied to the common electrode 150 (also referred to as a common potential), in which case disordered orientation in the liquid crystal layer 134 can be suppressed.

Therefore, the potential applied to the first conductive film 128 is set higher than that applied to the second conductive film 148. Note that the absolute values of the potentials are compared here because the potentials applied can be positive or negative depending on specifications of the semiconductor device.

Although an example in which the second conductive film 148 is formed in an island shape over the first transistor 250 is given in this embodiment, the present invention is not limited to this example. For example, the second conductive film 148 may be formed over the entire area of the gate driver circuit portion 106. In that case, the gate driver circuit portion 106 can be protected from electrostatic discharge (so called ESD).

Next, the pixel portion 104 is described below.

The pixel portion 104 includes the first substrate 102 and the second transistor 252 which includes the gate electrode 116 formed over the first substrate 102, the gate insulating film 117 formed over the gate electrode 116, the semiconductor layer 118 formed over the gate insulating film 117, and the source electrode 120 and the drain electrode 122 formed over the gate insulating film 117 and the semiconductor layer 118.

In addition, the pixel portion 104 includes the first insulating film 124 formed using an inorganic material over the second transistor 252, specifically, over the gate insulating film 117, the semiconductor layer 118, the source electrode 120, and the drain electrode 122, and the second insulating film 126 formed using an organic material over the first insulating film 124.

Furthermore, the pixel portion 104 includes a first conductive film 129 formed over the second insulating film 126 over the second transistor 252 in a region overlapping with the semiconductor layer 118, a third insulating film 139 formed using an inorganic material over the first conductive film 129, and a second conductive film 149 formed over the third insulating film 139 in a region overlapping with the first conductive film 129. Note that the first conductive film 129 is electrically connected to the drain electrode 122 through an opening formed in the first insulating film 124 and the second insulating film 126.

The first conductive film 129 functions as a back gate electrode of the second transistor 252. By application of a potential to the first conductive film 129, the threshold voltage of the second transistor 252 can be controlled. The function of the back gate electrode is similar to that in the first transistor 250 in the gate driver circuit portion 106, and description is therefore omitted here.

A region other than the second transistor 252 in the pixel portion 104 includes the pixel electrode 130 formed over the second insulating film 126, a third insulating film 140 formed over the pixel electrode 130, the common electrode 150 formed over the third insulating film 140, and the liquid crystal layer 134 formed over the common electrode 150.

The pixel electrode 130, the third insulating film 140, and the common electrode 150 form a capacitor 254, and the pixel electrode 130, the third insulating film 140, the common electrode 150, and the liquid crystal layer 134 form a liquid crystal element 256.

The pixel electrode 130, the third insulating film 140, and the common electrode 150 which form the capacitor 254 are each preferably formed using a material having the property of transmitting visible light, in which case large capacitance can be ensured without reducing the aperture ratio of the pixel portion 104.

The pixel electrode 130 functions as one of a pair of electrodes of the liquid crystal element 256. In addition, the pixel electrode 130 functions as one of a pair of electrodes of the capacitor 254.

The common electrode 150 has a comb-shaped portion; each of teeth of the comb-shaped portion overlaps with the pixel electrode 130 with the third insulating film 140 provided therebetween. The common electrode 150 functions as the other of the pair of electrodes of the liquid crystal element 256. In addition, the common electrode 150 functions as the other of the pair of electrodes of the capacitor 254.

The common electrode 150 is electrically connected to an electrode 115 through an opening provided in the gate insulating film 117, the first insulating film 124, and the second insulating film 126. The electrode 115 is formed in the same step as the gate electrode 116. In addition, the electrode 115 may be set at a potential equal to the potential applied to the gate electrode 116.

Note that the first conductive films 128 and 129 are formed in the same step as the pixel electrode 130, the third insulating films 138 and 139 are formed in the same step as the third insulating film 140, and the second conductive films 148 and 149 are formed in the same step as the common electrode 150. Therefore, the first conductive films 128 and 129 functioning as the back gate electrodes can be formed over the first transistor 250 and the second transistor 252 without an increase in the number of manufacturing steps.

The first conductive film 128 may be electrically connected to the pixel electrode 130. The first conductive film 129 may be electrically connected to the pixel electrode 130. Each of the first conductive films 128 and 129 may be electrically connected to the pixel electrode 130.

The second conductive film 148 may be electrically connected to the common electrode 150. The second conductive film 149 may be electrically connected to the common electrode 150. Each of the second conductive films 148 and 149 may be electrically connected to the common electrode 150.

In this manner, the connections of the first conductive film 128, the first conductive film 129, the pixel electrode 130, and the common electrode 150 can be determined optimally by a practitioner. For example, the potential for the common electrode may be applied to the first conductive film 128 and the pixel electrode 130, and the potential for the pixel electrode may be applied to the first conductive film 129 and the common electrode 150. In that case, the pixel electrode is located on the liquid crystal layer 134 side; thus, the potential applied to the pixel electrode may be adjusted as appropriate so as to prevent disordered orientation in the liquid crystal layer 134 or an image persistence problem with the liquid crystal layer 134.

Note that a first potential applied to the first conductive films 128 and 129 and the pixel electrode 130 is higher than a second potential applied to the second conductive films 148 and 149 and the common electrode 150.

The first conductive film 128 in the gate driver circuit portion 106 and the first conductive film 129 in the pixel portion 104 may be controlled independently of each other. For example, a potential may be applied only to the first conductive film 128 in the gate driver circuit portion 106, and no potential may be applied to the first conductive film 129 in the pixel portion 104.

The second conductive film 148 in the gate driver circuit portion 106 and the second conductive film 149 in the pixel portion 104 may be controlled independently of each other. For example, a potential may be applied only to the second conductive film 148 in the gate driver circuit portion 106, and no potential may be applied to the second conductive film 149 in the pixel portion 104.

A circuit configuration of the pixel portion 104 illustrated in FIGS. 1C and 2A is described here with reference to FIG. 2B.

FIG. 2B illustrates an example of a pixel circuit which can be used in the pixel portion 104. In accordance with a signal through a scan line GL from the gate driver circuit portion 106, the second transistor 252 is turned on to write data from the data line DL. The second transistor 252 is connected to the first conductive film 129, which functions as the back gate electrode. A potential is applied to the back gate electrode in accordance with a signal from the back gate line BL. The threshold voltage of the second transistor 252 can be controlled with the back gate electrode.

When the second transistor 252 is turned off, the liquid crystal element 256 and the capacitor 254 in which the data has been written are brought into a holding state. This operation is sequentially performed on a plurality of pixels row by row; thus, an image is displayed. One of the pair of electrodes of the capacitor 254 is electrically connected to a potential supply line VL, and the other is electrically connected to one of the pair of electrodes of the liquid crystal element 256. The potential of the potential supply line VL is set as appropriate depending on specifications. The capacitor 254 functions as a storage capacitor for retaining written data.

Here, other components of the semiconductor device illustrated in FIGS. 1A to 1C and FIGS. 2A and 2B are detailed below.

For the first substrate 102 and the second substrate 110, a glass material such as aluminosilicate glass, aluminoborosilicate glass, or barium borosilicate glass is used. In the mass production, for the first substrate 102 and the second substrate 110, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time might shrink such a mother glass drastically. Thus, in the case of mass production with the use of such a mother glass, heat treatment in a manufacturing process is preferably performed at a temperature of 600° C. or lower, more preferably 450° C. or lower, still more preferably 350° C. or lower.

For the electrode 115 and the gate electrode 116, a metal element selected from the group of aluminum, chromium, copper, tantalum, titanium, molybdenum, and tungsten, an alloy containing any of these metal elements as a component, an alloy containing these metal elements in combination, or the like can be used. Further, the gate electrode 116 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from the group of titanium, tantalum, tungsten, molybdenum, chromium, neodymium, and scandium may be used.

Examples of the gate insulating film 117 are a silicon oxide film, a silicon oxynitride film, a silicon nitride oxide film, a silicon nitride film, an aluminum oxide film, a silicon nitride film, a silicon nitride oxide film, and the like, and a single layer or a stacked layer of such films is used as the gate insulating film 117.

The gate insulating film 117 can be formed as a gate insulating film which has few defects and releases less hydrogen and less ammonia, when it is formed to have a stacked-layer structure in which a silicon nitride film having few defects is used as a first silicon nitride film, a silicon nitride film which releases less hydrogen and less ammonia is used as a second silicon nitride film over the first silicon nitride film, and an oxide insulating film is formed over the second silicon nitride film. Thus, transfer of hydrogen and nitrogen, which are contained in the gate insulating film 117, to the semiconductor layer 118 can be inhibited.

The use of a silicon nitride film as the gate insulating film 117 offers the following effect. The silicon nitride film has a higher relative permittivity than a silicon oxide film and needs a larger thickness for an equivalent capacitance. Thus, the physical thickness of the gate insulating layer can be increased. This makes it possible to reduce a decrease in withstand voltage of a transistor and furthermore increase the withstand voltage, thereby reducing electrostatic discharge damage to the transistor.

The thickness of the gate insulating film 117 is from 5 nm to 400 nm, preferably 10 nm to 300 nm, more preferably 50 nm to 250 nm.

An oxide semiconductor is used for the semiconductor layer 118, which preferably contains at least indium (In) or zinc (Zn) or both In and Zn. In order to reduce variation in electrical characteristics of the transistor including the oxide semiconductor, the oxide semiconductor preferably contains one or more stabilizers in addition to In and/or Zn.

As a stabilizer, gallium (Ga), tin (Sn), hafnium (Hf), aluminum (Al), zirconium (Zr), and the like can be given.

As the oxide semiconductor, for example, any of the following can be used: indium oxide, tin oxide, zinc oxide, an In—Zn-based metal oxide, a Sn—Zn-based metal oxide, an Al—Zn-based metal oxide, an In—Ga-based metal oxide, an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, and an In—Hf—Al—Zn-based metal oxide.

Note that an In—Ga—Zn-based metal oxide, for example, is an oxide whose main components are In, Ga, and Zn, and there is no particular limitation on the ratio of In:Ga:Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

Further, the energy gap of an oxide semiconductor film that can be used as the semiconductor layer 118 is 2 eV or higher, preferably 2.5 eV or higher, more preferably 3 eV or higher. In this manner, the off-state current of a transistor can be reduced by using an oxide semiconductor film having a wide energy gap.

In addition, the oxide semiconductor film used as the semiconductor layer 118 may have an amorphous structure, a single crystal structure, or a polycrystalline structure.

As the oxide semiconductor film used as the semiconductor layer 118, a c-axis aligned crystalline oxide semiconductor (CAAC-OS) film including crystal parts may be used.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not observed. Thus, in the CAAC-OS film, a reduction in electron mobility resulting from the grain boundary is not caused.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°. Note that part of oxygen included in the oxide semiconductor film may be substituted with nitrogen.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

The thickness of the oxide semiconductor film used as the semiconductor layer 118 is preferably from 1 nm to 100 nm, more preferably from 1 nm to 30 nm, still more preferably 1 nm to 50 nm, further preferably 3 nm to 20 nm.

The concentration of an alkali metal or an alkaline earth metal in the oxide semiconductor film used as the semiconductor layer 118, which is measured by secondary ion mass spectrometry (SIMS), is preferably $1\times10^{18}$ atoms/cm$^3$ or lower, more preferably $2\times10^{16}$ atoms/cm$^3$ or lower. This is because an alkali metal and an alkaline earth metal are bonded to an oxide semiconductor to generate carriers in some cases and thus cause an increase in off-state current of the transistor.

Further, the hydrogen concentration in the oxide semiconductor film used for the semiconductor layer 118, which is measured by secondary ion mass spectrometry, is preferably lower than $5\times10^{18}$ atoms/cm$^3$, more preferably $1\times10^{18}$ atoms/cm$^3$ or lower, still more preferably $5\times10^{17}$ atoms/cm$^3$ or lower, further preferably $1\times10^{16}$ atoms/cm$^3$ or lower.

Hydrogen contained in the oxide semiconductor film reacts with oxygen bonded to a metal atom to produce water, and a defect is formed in a lattice from which oxygen is released (or a portion from which oxygen is removed). In addition, a bond of part of hydrogen and oxygen causes generation of electrons serving as carriers. Thus, the impurities containing hydrogen are reduced as much as possible in the step of forming the oxide semiconductor film, whereby the hydrogen concentration in the oxide semiconductor film can be reduced. Accordingly, the oxide semiconductor film from which hydrogen is removed as much as possible is used for a channel region, whereby a negative shift of a threshold voltage can be inhibited and variation in electrical characteristics can be reduced. Further, leakage current between a source and a drain of a transistor, typically off-state current, can be reduced.

The source electrode 120 and the drain electrode 122 are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The source electrode 120 and the drain electrode 122 are provided over the semiconductor layer 118 in this embodiment but may be provided between the gate insulating film 117 and the semiconductor layer 118.

As the first insulating film 124, an oxide insulating film of an inorganic material is preferably used so as to improve characteristics of the interface with the oxide semiconductor film used as the semiconductor layer 118. As the first insulating film 124, a silicon oxide film, a silicon oxynitride film, an aluminum oxide film, or the like having a thickness of from 150 nm to 400 nm can be used. The first insulating film 124 may have a stacked-layer structure of an oxide insulating film and a nitride insulating film. For example, the first insulating film 124 can have a stacked-layer structure of a silicon oxynitride film and a silicon nitride film.

Further, the second insulating film 126 can be formed using an organic material having heat resistance, such as an acrylic-based resin, a polyimide-based resin, a benzocyclobutene-based resin, a polyamide-based resin, or an epoxy-based resin. Note that the second insulating film 126 may be formed by stacking a plurality of insulating films formed using any of these materials. With the use of the second insulating film 126, the unevenness due to the first transistor 250 and the like can be reduced.

The first conductive films 128 and 129 and the pixel electrode 130 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The third insulating films 138, 139, and 140 can be formed using an inorganic material such as a silicon oxide film, a silicon oxynitride film, a silicon nitride oxide film, a silicon nitride film, or an aluminum oxide film. In particular, one selected from a silicon nitride film, a silicon nitride oxide film, and an aluminum oxide film is preferably used as the third insulating films 138, 139, and 140. By use of one selected from a silicon nitride film, a silicon nitride oxide film, and an aluminum oxide film as the third insulating films 138, 139, and 140, release of hydrogen or moisture from the second insulating film 126 can be suppressed.

For the second conductive films 148 and 149 and the common electrode 150, a material similar to that used for the first conductive films 128 and 129 and the pixel electrode 130 can be used. Although either the same material or different materials may be used for the second conductive films 148 and 149 and the common electrode 150 and for the first conductive films 128 and 129 and the pixel electrode 130, the use of the same material is preferable because manufacturing cost can be reduced.

For the liquid crystal layer 134, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

As a driving mode of the liquid crystal element 256 in the semiconductor device illustrated in FIGS. 1A to 1C and FIGS. 2A and 2B, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used. In particular, an FFS mode is preferably used to achieve a wide viewing angle.

The semiconductor device may be a normally black liquid crystal display device such as a transmissive liquid crystal display device utilizing a vertical alignment (VA) mode. Some examples are given as the vertical alignment mode. For example, a multi-domain vertical alignment (MVA) mode, a patterned vertical alignment (PVA) mode, and the like can be used. Moreover, it is possible to use a method called domain multiplication or multi-domain design, in which a pixel is divided into some regions (subpixels) and molecules are aligned in different directions in their respective regions.

Although not illustrated in FIGS. 1A to 1C and FIGS. 2A and 2B, an alignment film, an optical member (optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

As a display method in the pixel portion 104, progressive scan, interlace scan, or the like can be employed. Further, color elements controlled in a pixel at the time of color display are not limited to three colors of R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Further, a spacer 136 is formed on the second substrate 110 side so as to control the distance (cell gap) between the first substrate 102 and the second substrate 110. Note that the cell gap determines the thickness of the liquid crystal layer 134. The spacer 136 may have any shape, like a columnar spacer or a spherical spacer formed by selective etching of an insulating film, or the like.

As the sealant 112, a thermosetting resin, an ultraviolet curable resin, or the like can be used. Although an example in which the gate insulating film 117 and the first insulating film 124 are placed between the first substrate 102 and the second substrate 110 in a region sealed by the sealant 112 illustrated in FIG. 2A is given, the present invention is not limited to this example. For example, in the region sealed by the sealant 112, the gate insulating film 117, the first insulating film 124, and the third insulating film 138 may be formed. As illustrated in FIG. 2A, in the region sealed by the sealant 112, the second insulating film 126 formed using an organic material is preferably removed, because penetration of moisture and the like from outside is not caused.

The structure described above in this embodiment can be combined as appropriate with any of the structures described in the other embodiments.

Embodiment 2

In this embodiment, an embodiment different from the semiconductor device described above in Embodiment 1 is described below with reference to FIGS. 3A and 3B. Note that the same portions as or portions having functions similar to those of the transistor described in Embodiment 1 are denoted by the same reference numerals, and repeated description thereof is omitted.

Figure 3A:
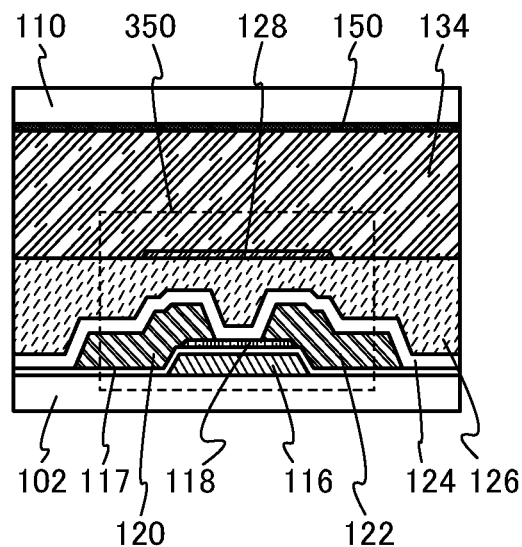
FIGS. 3A and 3B are cross-sectional views of transistors which can each be used in a driver circuit portion of a semiconductor device.
Figure 3B:
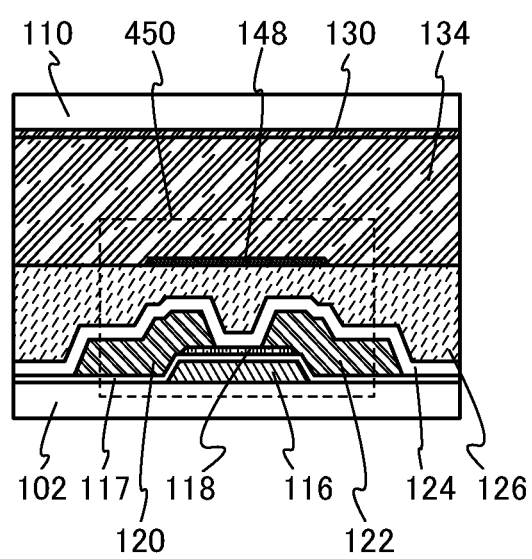

Semiconductor devices illustrated in FIGS. 3A and 3B are examples of transistors which can be used in the gate driver circuit portion 106 of the semiconductor device described in Embodiment 1 with reference to FIGS. 2A and 2B.

A transistor 350 illustrated in FIG. 3A includes the gate electrode 116 formed over the first substrate 102, the gate insulating film 117 formed over the gate electrode 116, the semiconductor layer 118 formed over the gate insulating film 117, and the source electrode 120 and the drain electrode 122 formed over the semiconductor layer 118.

In addition, the first insulating film 124 is formed using an inorganic insulating material over the transistor 350, specifically, over the gate insulating film 117, the semiconductor layer 118, the source electrode 120, and the drain electrode 122, and the second insulating film 126 is formed using an organic insulating material over the first insulating film 124.

Furthermore, the first conductive film 128 is formed over the second insulating film 126 over the transistor 350 in a region overlapping with the semiconductor layer 118.

In addition, the liquid crystal layer 134 is formed over the first conductive film 128, and the common electrode 150 is formed over the liquid crystal layer 134. Although an embodiment in which the common electrode 150 is formed on the first substrate 102 side is described above in Embodiment 1, the common electrode 150 may be provided on the second substrate 110 side as described in this embodiment.

Note that disordered orientation in the liquid crystal layer 134 can be suppressed by setting the first conductive film 128 at a potential equal to the potential applied to the common electrode 150. In addition, the potential of a back channel side of the transistor 350 can be fixed by applying the potential to the first conductive film 128. Thus, a possible influence of charge on the back channel side due to a reliability test can be reduced.

A transistor 450 illustrated in FIG. 3B includes the gate electrode 116 formed over the first substrate 102, the gate insulating film 117 formed over the gate electrode 116, the semiconductor layer 118 formed over the gate insulating film 117, and the source electrode 120 and the drain electrode 122 formed over the semiconductor layer 118.

In addition, the first insulating film 124 is formed using an inorganic insulating material over the transistor 450, specifically, over the gate insulating film 117, the semiconductor layer 118, the source electrode 120, and the drain electrode 122, and the second insulating film 126 is formed using an organic insulating material over the first insulating film 124.

Furthermore, the second conductive film 148 is formed over the second insulating film 126 over the transistor 450 in a region overlapping with the semiconductor layer 118.

In addition, the liquid crystal layer 134 is formed over the second conductive film 148, and the pixel electrode 130 is formed over the liquid crystal layer 134. Although an embodiment in which the pixel electrode 130 is formed on the first substrate 102 side is described above in Embodiment 1, the pixel electrode 130 may be provided on the second substrate 110 side as described in this embodiment.

Note that disordered orientation in the liquid crystal layer 134 can be suppressed because the common potential is applied to the second conductive film 148. Note that the potential of a back channel side of the transistor 450 can be fixed by applying the potential to the second conductive film 148. Thus, a possible influence of charge on the back channel side due to a reliability test can be reduced.

Although an example in which the first conductive film 128 and the second conductive film 148 are stacked with the third insulating film 138 provided therebetween is given above in Embodiment 1, one of the first conductive film 128 and the second conductive film 148 may be provided over the transistor in the gate driver circuit portion 106 as described in this embodiment.

Thus, a display device can be obtained which includes a pixel electrode provided as one electrode of a liquid crystal element; a common electrode provided as the other electrode of the liquid crystal element so as to face the pixel electrode; a transistor electrically connected to at least one of the pixel electrode and the common electrode and including a gate electrode, a gate insulating film formed over the gate electrode, a semiconductor layer formed over the gate insulating film, and a source electrode and a drain electrode formed over the semiconductor layer; a first insulating film formed using an inorganic material over the transistor; a second insulating film formed using an organic material over the first insulating film; and a conductive film formed over the second insulating film and formed in a region overlapping with the semiconductor layer. The conductive film is at the same potential as the common electrode.

As described above, a transistor in a gate driver circuit portion of a display device (especially, a liquid crystal display) is preferably configured such that an electric field in the driver circuit portion does not adversely affect display, and particularly such that an electric field over the gate driver circuit portion or a source driver circuit portion does not adversely affect display even when the area of the gate driver circuit portion or the source driver circuit portion is reduced by a decrease in frame width or the like.

A first conductive film and/or a second conductive film each functioning as a back gate electrode in the gate driver circuit portion can be formed at the same time as a pixel electrode and/or a common electrode in a pixel portion, which is favorable because the manufacturing process can be simplified.

The structure described above in this embodiment can be combined as appropriate with any of the structures described in the other embodiments.

This application is based on Japanese Patent Application serial no. 2012-252106 filed with Japan Patent Office on Nov. 16, 2012, the entire contents of which are hereby incorporated by reference.

What is claimed is:

1. A display device comprising:
    a transistor comprising:
        a gate electrode;
        a gate insulating film over the gate electrode;
        a semiconductor layer over the gate insulating film; and
        a source electrode and a drain electrode over the semiconductor layer;
    a first insulating film comprising an inorganic material over the transistor;
    a second insulating film comprising an organic material over the first insulating film;
    a first conductive film located over the second insulating film and overlapping with the semiconductor layer;
    a pixel electrode over the second insulating film, the pixel electrode electrically connected to the first conductive film;
    a third insulating film comprising an inorganic material over the first conductive film and the pixel electrode;
    a second conductive film located over the third insulating film and overlapping with the first conductive film;
    a common electrode over the third insulating film, the common electrode electrically connected to the second conductive film;
    an electrode electrically connected to the common electrode through an opening provided in the gate insulating film, the first insulating film, and the second insulating film; and
    a liquid crystal layer over the second conductive film and the common electrode.

2. The display device according to claim 1, wherein the semiconductor layer is an oxide semiconductor layer.

3. The display device according to claim 1, wherein the transistor is provided in a driver circuit portion of the display device.

4. The display device according to claim 2, wherein the oxide semiconductor layer comprises at least one oxide selected from the group consisting of indium oxide, tin oxide, and zinc oxide.

5. The display device according to claim 2, wherein the oxide semiconductor layer is an In—Ga—Zn-based oxide semiconductor layer.

6. The display device according to claim 2,
    wherein the oxide semiconductor layer comprises a crystal part, and
    wherein a c-axis of the crystal part is parallel to a normal vector of a surface where the oxide semiconductor layer is formed.

* * * * *